(12) United States Patent
Chidhambarakrishnan

(10) Patent No.: US 7,627,463 B2
(45) Date of Patent: Dec. 1, 2009

(54) METHOD AND SYSTEM FOR PERFORMING CHANNEL ANALYSIS

(75) Inventor: Kumar Chidhambarakrishnan, Medford, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 725 days.

(21) Appl. No.: 11/089,898

(22) Filed: Mar. 25, 2005

(65) Prior Publication Data

US 2006/0217949 A1    Sep. 28, 2006

(51) Int. Cl.
*G06F 17/50* (2006.01)
(52) U.S. Cl. ........................................... 703/14
(58) Field of Classification Search ............ 703/2, 703/13, 14
See application file for complete search history.

(56) References Cited

U.S. PATENT DOCUMENTS

| | | |
|---|---|---|
| 5,280,612 A | 1/1994 | Lorie et al. |
| 5,471,629 A | 11/1995 | Risch |
| 5,806,076 A | 9/1998 | Ngai et al. |
| 5,938,775 A | 8/1999 | Damani et al. |

OTHER PUBLICATIONS

Chao et al., C-Y. OptimalTesting of VLSI Analog Circuits, IEEE Transactions on Computer-Aided Design of Integrated Circuits and Systems, vol. 16, No. 1, Jan. 1997, pp. 58-77.*

Doberstein et al., S.A. A Wide-Range Tunable/Switchable Low-Loss SAW Filter, IEEE, Ultrasonics Symposium, vol. 1, Oct. 2000, pp. 87-90.*

Ahmad, B. "Performance Specification of Interconnects" High-Performance System Design Conference (DesignCon 2003), Title page, copyright page, 13 pgs.

Bhattacharyya, B.K. et al. "Impact on Inter Symbol Interference (ISI) Noise Due to Simulation Error" Proceedings of the IEEE 14th Topical Meeting on Electrical Performance of Electronic Packaging, Oct. 24-26, 2005, pp. 221-224.

Carlsson, A. et al. "Receiver Model Including Square-Law Detection and ISI from Arbitrary-Electrical Filtering" Proceedings of the Optical Fiber Communications Conference (OFC 2003), Mar. 23-28, 2003, vol. 1, pp. 68-69.

Damani, O.P. et al. "Optimistic Recovery in Multi-threaded Distributed Systems" Proceedings of the 18th IEEE Symposium on Reliable Distributed Systems, Oct. 19-22, 1999, pp. 234-243.

Fornberg, P. et al. "Transmitter Clock Recovery and Jitter Analysis Methodology for PCI Express Signaling" Title page, Copyright page, Table of Contents, pp. 1-23, 2003.

Liu, D.-Z. et al. "Asynchronous Symbol Timing Recovery with Adaptive Interpolation Filter for High Data-Rate Digital Mobile Radio" IEEE International Symposium on Circuits and Systems (ISCAS 2000), Geneva, Switzerland, May 28-31, 2000, pp. II-85-II-89.

(Continued)

*Primary Examiner*—Russell Frejd
(74) *Attorney, Agent, or Firm*—Vista Law Group, LLP (57) ABSTRACT

A system, method, computer program and article of manufacture for channel analysis. Channel analysis is a multi gigahertz capacity time domain circuit simulation which uses the impulse response of the channel to determine optimum filter settings and to produce wave form plots in a fraction of the time of circuit simulation.

31 Claims, 8 Drawing Sheets

OTHER PUBLICATIONS

Maehara, F. et al. "Inter-symbol Interference Suppression Employing Sub-carrier Group Selection for OFDM-TDD Transmit Delivery" Proceedings of the 2nd International Symposium on Wireless Communication Systems, Sep. 5-7, 2005, pp. 515-519.

Mannerkoski, J. et al. "Prediction-Based Blind Equalization Using Channel Encoded Data" Proceedings of the 5th International Symposium on Signal Processing and its Application (ISSPA '99), Brisbane, Australia, Aug. 22-25, 1999, pp. 769-772.

Nadakuditi, R. " A Channel Subspace Post-Filtering Approach to Adaptive Least-Squares Estimation" IEEE Transactions on Signal Processing, Jul. 2004, vol. 52, No. 7, pp. 1901-1914.

Oh, M.-K. et al. "A Novel Blind Adaptive Equalization in Time-Varying Channels with ISI" Proceedings of the 57th IEEE Semiannual Vehicular Technology Conference (VTC 2003-Spring), Apr. 22-25, 2003, vol. 3, pp. 1862-1866.

Piazzo, L. et al. "On the Inter-Symbol-Interference in several Ultra Wideband Systems" Proceedings of the 2nd International Symposium on Wireless Communication Systems, Sep. 5-7, 2005, pp. 259-262.

Wang, Y.-M. et al. "Distributed Recovery with K-Optimistic Logging" Proceedings of the 17th International Conference on Distributed Computing Systems, May 27-30, 1997, pp. 60-67.

* cited by examiner

Eye contour

Eye Distribution waveform

METHOD AND SYSTEM FOR PERFORMING CHANNEL ANALYSIS

BACKGROUND AND SUMMARY

This invention related to computer systems, and more particularly to electronic circuit design.

In electronic circuit design, microprocessor speed continues to increase. Higher speed microprocessors require higher speed data flow. These increased bandwidth requirements (some data rates are in the 1 Gigabit per second (Gbps) range) have proved troublesome to the interconnections, or buses, of the design. The buses that connect one microprocessor to another microprocessor may have many problems when trying to transmit high speed data and proved to be the limiting factor in a design.

One method of handling the high speed is to use serial data link instead of buses in the design. Serial data links reduce the number of interconnects required, simplifying the design, while at the same time boosting the amount of data throughput in each interconnect. For example, the clock and data lines in a bus design are separate lines, whereas the clock and data lines in a serial link are entwined and sent together.

A method for high capacity integrated circuit simulation is described. One method for high-capacity simulation includes obtaining a channel characterization and determining optimum filter settings.

DETAILED DESCRIPTION OF INVENTION

As mentioned above one method of handling the high speed data flow is to use serial data link design. The use of serial link techniques has a significant impact on circuit design. The traditional method of full time domain circuit simulation may no longer be adequate with high speed requirements. For example, to create an eye pattern for a high speed signal, large bit streams need to be simulated. However, these are costly in terms of simulation time. Post-route board-level verification involves simulating hundreds or thousands of high speed signals which dramatically increases the simulation time (e.g., 10 hours to simulate even 100 bits through the complex die-to-die signal path). In addition to the increased length of simulation time, the small number of bits (e.g., 100) is insufficient to predict a realistic eye pattern. This is caused by the inter-symbol interference (ISI).

Figure 1:
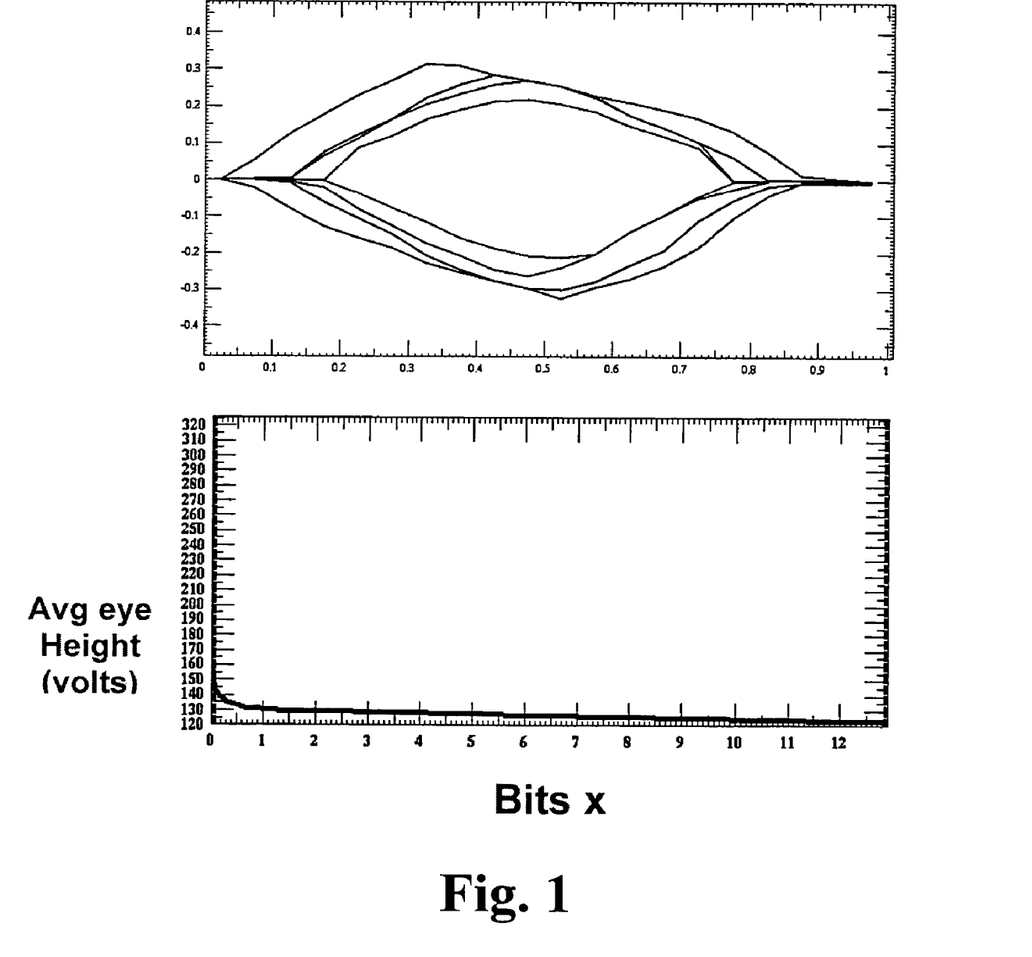
FIG. 1 is a an example eye chart and eye height chart.

Inter-symbol interferences (ISI) can be a challenge with serial data link design. ISI occurs when the effect of one bit impacts the integrity of other bits. The tail of one impulse response stretches out due to degradation of the signal and effects the subsequent impulse response. Signal degradation is caused by the effects of the interconnect channel itself. The eye pattern, shown in FIG. 1, progressively worsens, and plateaus at hundreds of thousands of bits due to long ISI.

Figure 2:
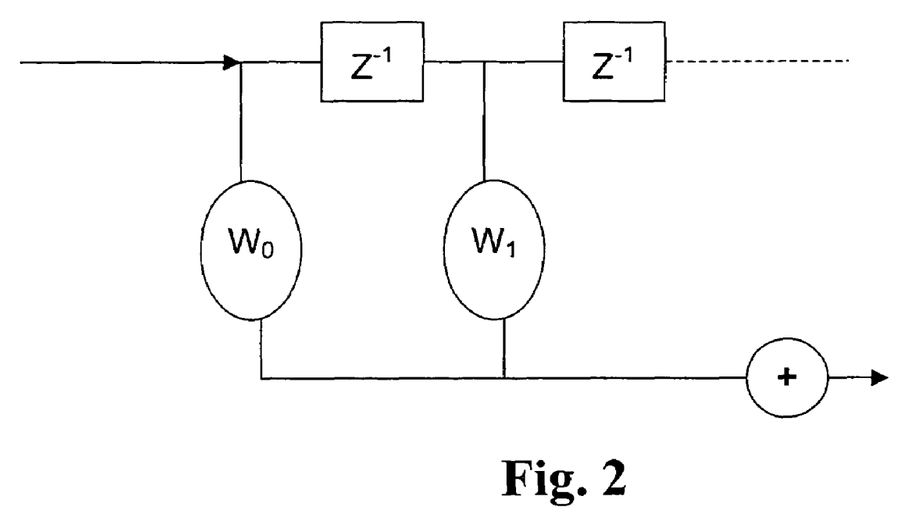
FIG. 2 is a representation of a pre-emphasis filter.

In order to overcome the effects of ISI, serial drivers and receivers may be designed to be highly signal integrity aware. Digital signal processing (DSP) techniques can be used to design filters to mitigate the signal degradation. For example, serial devices can employ pre-emphasis filters at the driver end. FIG. 2 shows an example pre-emphasis filter. Another method of handling high speed implementation is to include filters at the receiver end. One such filter may be the Decision Feedback Equalization (DFE) filter shown in FIG. 3.

Another challenge with serial link design is determining the appropriate settings for the filters. The appropriate settings overcome the losses and distortion effects in the channel and are dependent on the unique channel characteristics of the circuit. These settings may be difficult to determine with traditional techniques. For example, the device manufacturers may provide look-up tables or other general guidelines but these do not take into account the unique channel characteristics and are therefore inadequate and inexact.

Figure 4:
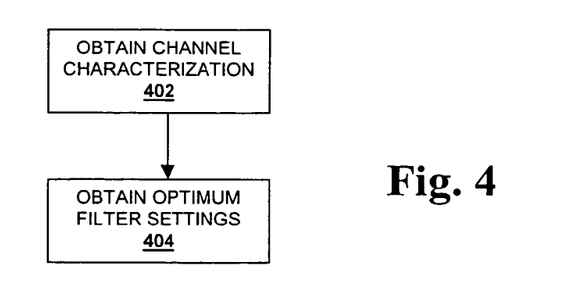
FIG. 4 is a representation of process 400, the channel analysis process.

One solution for high speed circuit design simulation and filter settings is channel analysis as shown by process 400 in FIG. 4. In channel analysis a circuit simulator can be used to characterize a single channel by deriving its impulse response in the time domain, 402. This technique captures the effects of parasitics present in the drivers and the receivers, unlike traditional methods which treat the passive interconnects and active devices separately. Since the effects of the parasitics are known, the optimum filter setting can also be determined, 404. Characterizing the interconnects and active devices together in channel analysis can provide an additional level of accuracy. Channel impulse response can be easily obtained from time domain circuit simulation means.

Figure 5A:
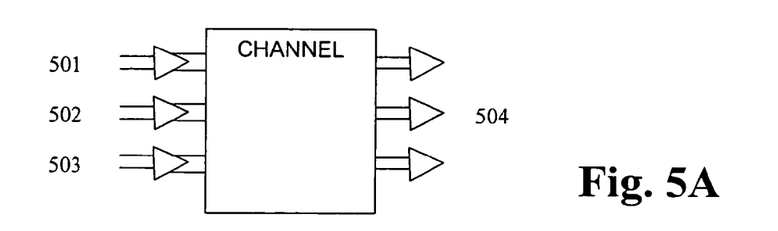
FIG. 5A is a representation of circuit abstraction.

In one embodiment, a channel simulator abstracts the circuit into a single node of interest. The single node of interest is driven by multiple driver nodes through their own dedicated channel. FIG. 5A shows an embodiment of a circuit abstraction. Transmitter 502 is the primary transmitter/driver, or transmitter/driver of interest. The remaining transmitters 501 and 503 are the neighboring transmitters which also drive output/receiver 504. Output/receiver 504 is the receiver of interest. When simulating a circuit abstraction, there are voltages and currents at all nodes.

Figure 5B:
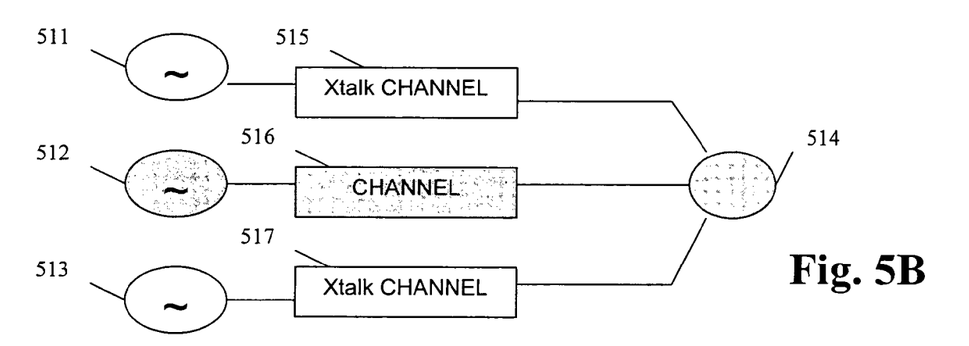
FIG. 5B is a representation of channel abstraction.

FIG. 5B shows the circuit abstraction converted to a channel abstraction. In the channel abstraction each driver drives the node of interest through its own dedicated channel. Driver 511 drives node 514 through channel 515, driver 513 drives node 514 thorough channel 517. Driver 512 is the driver of interest and it drives node 514 through channel 516. When performing channel analysis, there is just one voltage at the channel or node of interest.

Figure 6A:
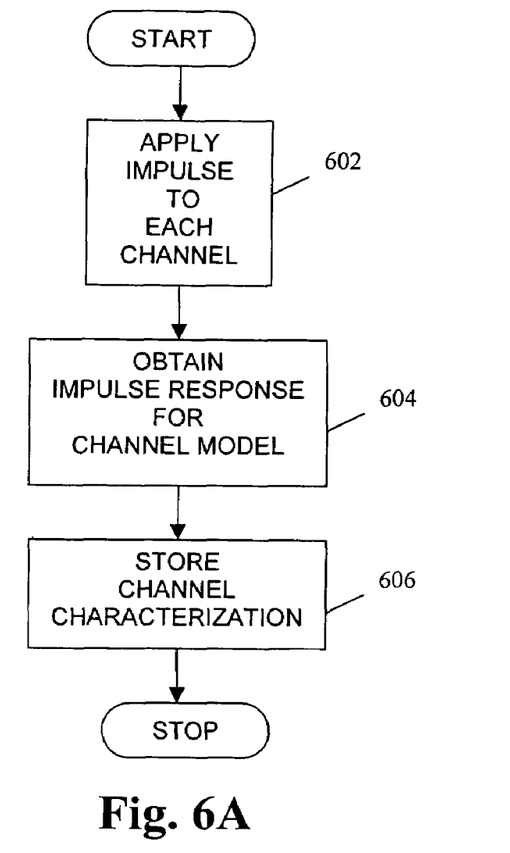
FIG. 6A shows a method of channel characterization.

Characterization is done once for a given channel. An example characterization process is shown in FIG. 6A. Process action 602 applies an impulse to each channel. The impulse response to the input impulse is obtained for each channel in process action 604. The channel response can be computed as the convolution sum of the impulse response and the stimuli and is further described below. Process action 606 stores the channel characterization. In one embodiment the channel characterization is stored as a library element.

Figure 6B:
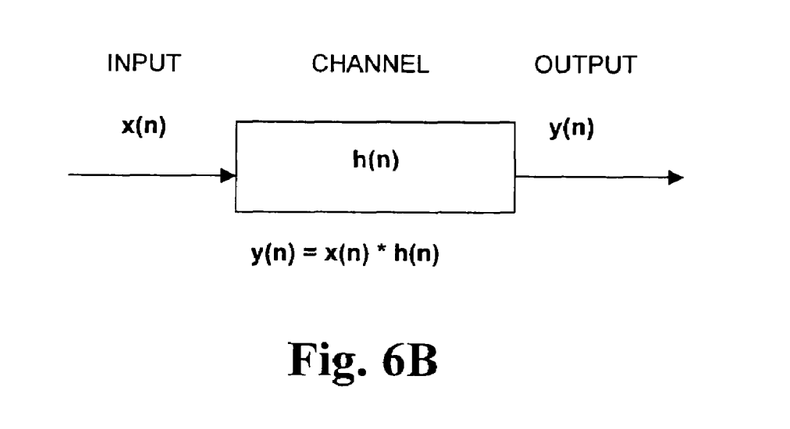
FIG. 6B is a representation of convolution.
Figure 7:
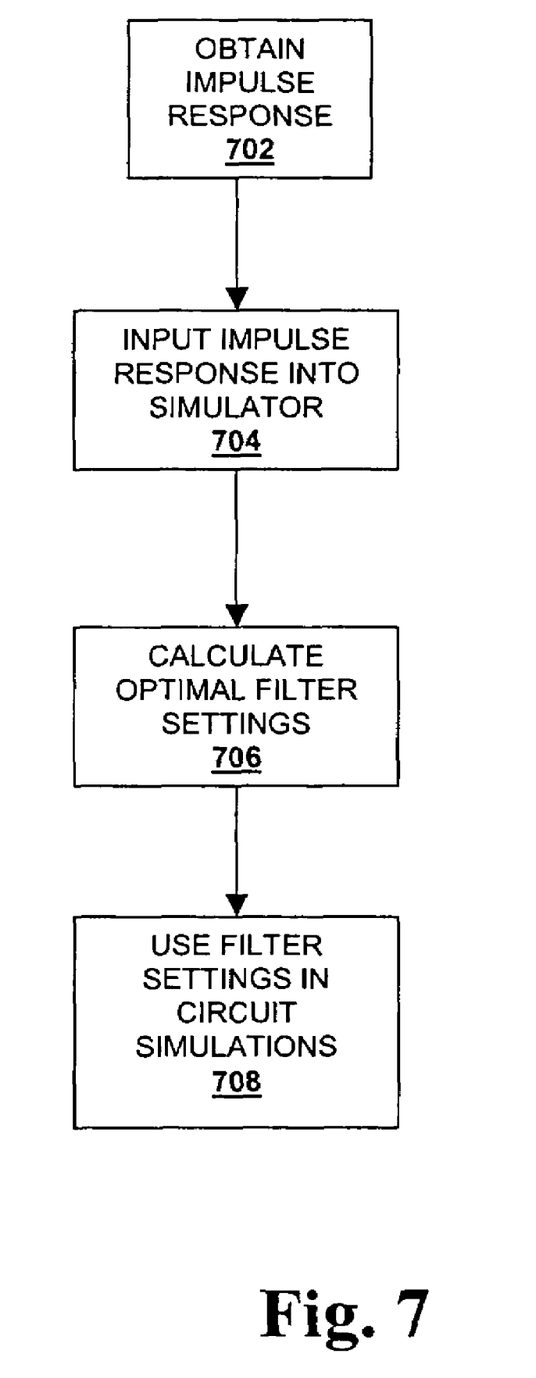
FIG. 7 is a representation of process 700, the process of determining filter coefficients.

As mentioned above the channel response can be computed as the convolution sum of the impulse response and the stimuli. The convolution is represented in FIG. 6B, where x(n) is the stimuli, h(n) is the impulse response, and output y(n) is the channel response. In another embodiment the simulator includes an accelerated time domain convolution using pre-computed convolution integrals.

Figure 3:
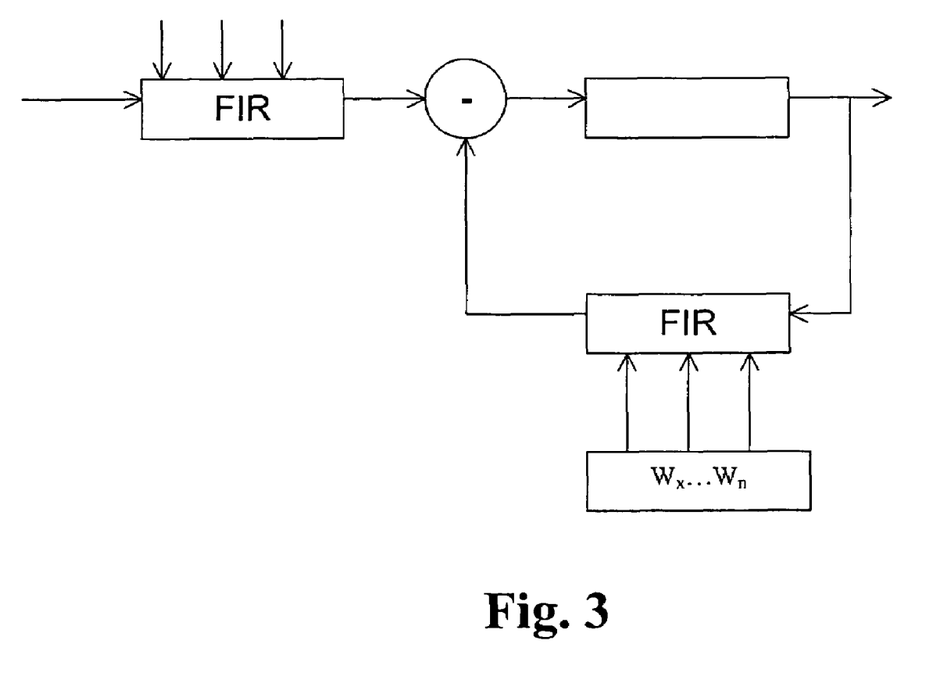
FIG. 3 is a representation of a decision feedback equalization filter.

The stimuli can represent real device stimuli and can accommodate arbitrary filtering schemes. These filtering schemes can be implemented in devices as driver pre-emphasis (as shown in FIG. 2) or equalization at the receiver end (as shown in FIG. 3). The syntax for the stimuli is:

(coeffs(<coeff_val><direction><delay>) ... )

where coeff_val is the numerical value usually given in terms of relative strength. Thus: (coeff (1 0 0) (0.25 1 320p)) represents a 2 tap driver with the second tap showing a pre-emphasis filter with a delay of 320 picoseconds.

Stimuli generation can employ sophisticated algorithms. In one embodiment the generation can support both pseudo-random bit sequence (PRBS) stimuli, and 8b10b coding of the stimuli if required. In another embodiment, users can also input their own pre-defined stimulus patterns.

In another embodiment, the channel simulator integrates synthesis of optimal filter settings into the simulation algorithms. The algorithms use the impulse response of the channel, and the captured effects of parasitics present in the drivers and the receivers to determine the optimal channel-specific settings in the driver. These settings can then be incorporated into the subsequent simulations. In this embodiment this feature is invoked in the channel simulation using a key field called "opttaps". For example, (opttaps (tapcnt 4) (auto)) instructs the simulator to automatically discover the optimal filter settings, "tapcnt" determines the number of desired taps, and "auto" direct the simulator to drive the channel with the discovered optimized filter settings.

Figure 8:
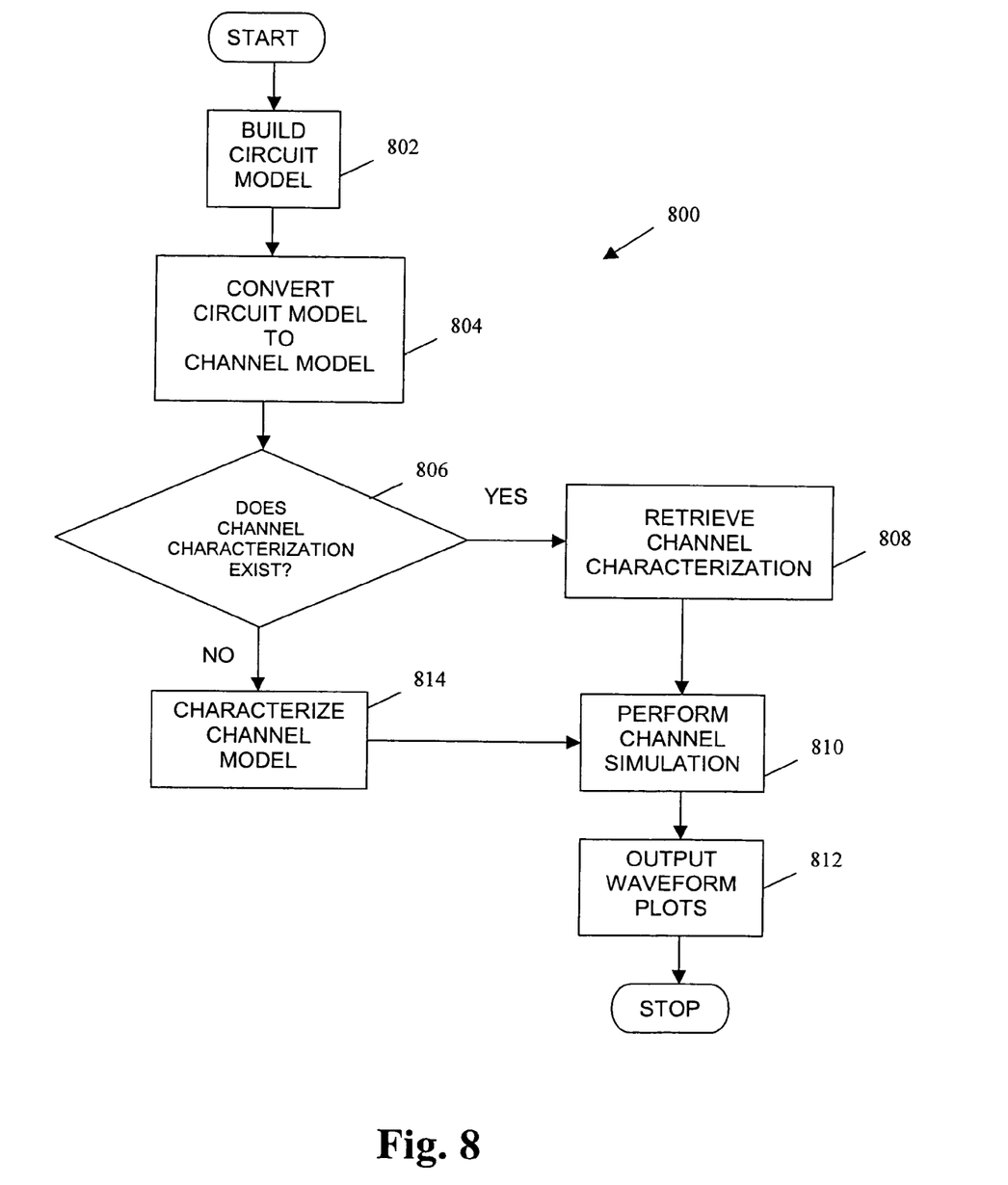
FIG. 8 is a representation of process 800, the method of simulating a circuit using channel simulation.
Figure 9:
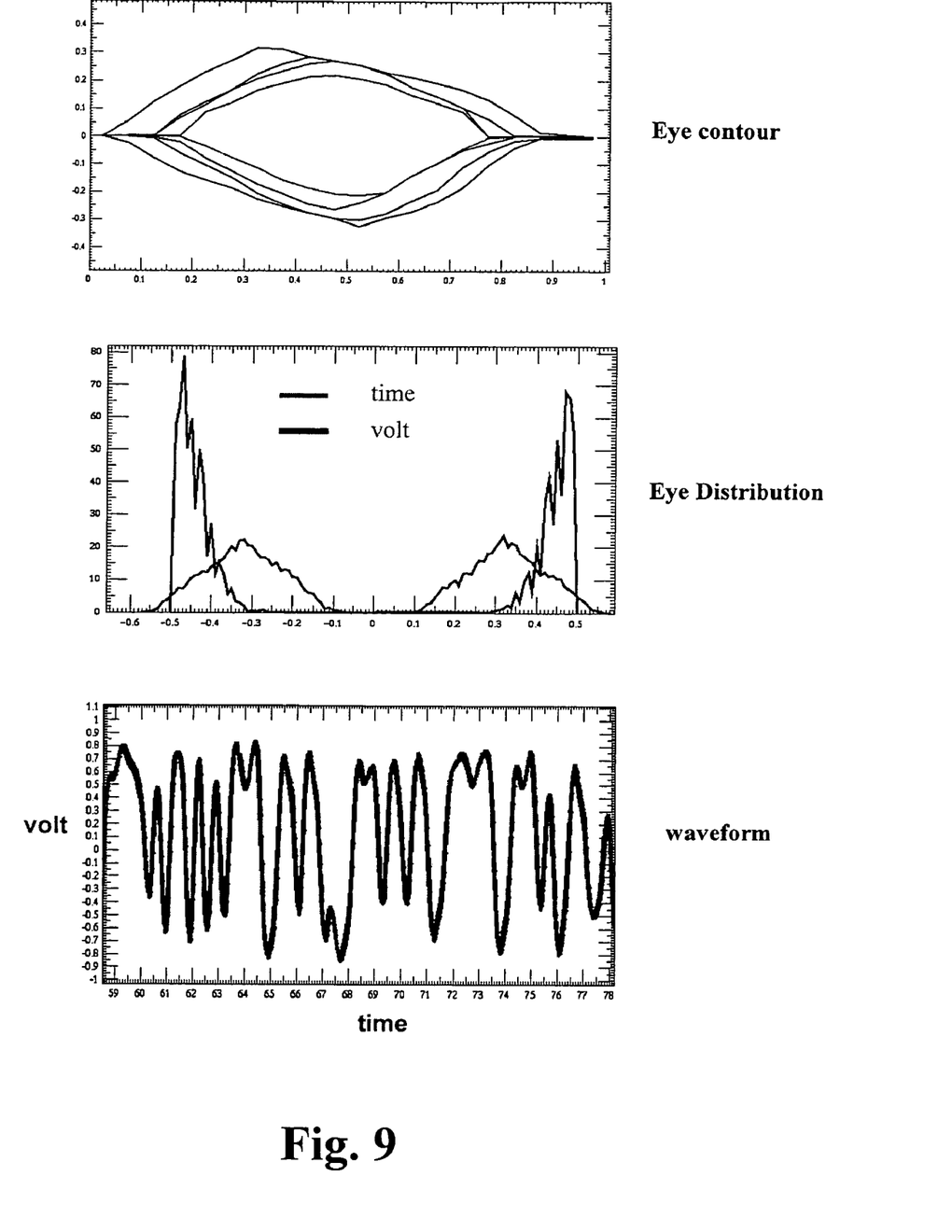
FIG. 9 is an example of output plots of the channel simulator.

FIG. 8 shows process 800, the method of circuit simulation using channel analysis. The circuit model is built in process action 802. An example circuit model is shown in FIG. 5A. The circuit model is converted to a channel model in process action 804. An example channel model is shown in FIG. 5B. Process action 806 determines if a channel characterization, or Impulse Response Characterization (ICR), has already been stored as a library element. If the characterization exists in the library, the channel characterization is retrieved in process action 808. If the channel characterization does not exist, the channel is characterized and stored in process action 814. In process action 810, the channel simulation is performed based on the characterization. The ICR is taken as input by the channel simulator, where it can quickly combine with large pseudo-random bit sequences in the frequency domain. Process action 812 uses the inverse Fast Fourier Transformation to produce the resulting plots, including an eye contour, an eye distribution, and a voltage vs. time waveform. Example plots are shown in FIG. 9.

Resulting time domain plots match very well with traditional circuit simulation results but enable bit streams of 100,000 to be simulated in less than 10 seconds. In another embodiment, tools to perform waveform to waveform comparison between traditional circuit simulation and channel analysis are available. The waveforms are correlated and overlaid for comparison.

System Architecture Overview

Figure 10:
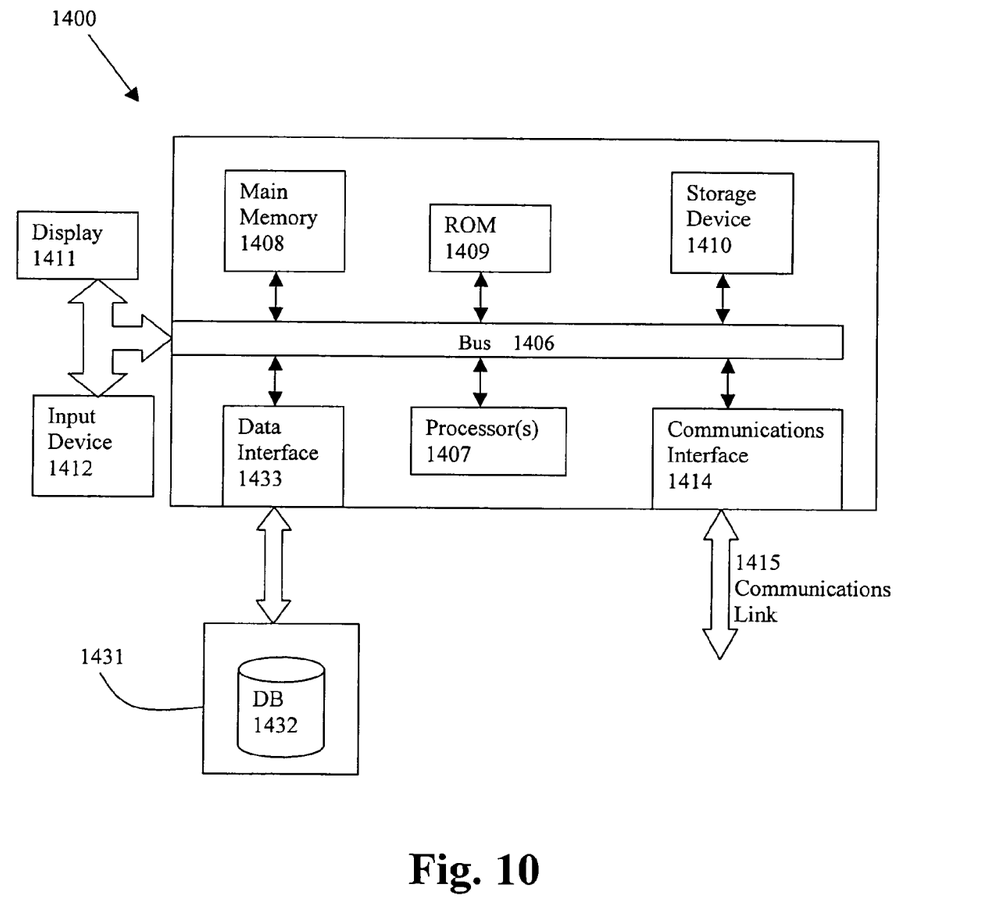
FIG. 10 is an example system that can provide simulation of a circuit design using channel simulation.

The execution of the sequences of instructions required may be performed in embodiments by a computer system 1400 as shown in FIG. 10. In an embodiment, execution of the sequences of instructions required is performed by a single computer system 1400. According to other embodiments, two or more computer systems 1400 coupled by a communication link 1415 may coordination with one another. In order to avoid needlessly obscuring the explanation, a description of only one computer system 1400 will be presented below; however, it should be understood that any number of computer systems 1400 may be employed to practice the invention.

A computer system 1400 according to an embodiment will now be described with reference to FIG. 10, which is a block diagram of the functional components of a computer system 1400 according to an embodiment. As used herein, the term computer system 1400 is broadly used to describe any computing device that can store and independently run one or more programs.

Each computer system 1400 may include a communication interface 1414 coupled to the bus 1406. The communication interface 1414 provides two-way communication between computer systems 1400. The communication interface 1414 of a respective computer system 1400 transmits and receives electrical, electromagnetic or optical signals, that include data streams representing various types of signal information, e.g., instructions, messages and data. A communication link 1415 links one computer system 1400 with another computer system 1400. For example, the communication link 1415 may be a LAN, in which case the communication interface 1414 may be a LAN card, or the communication link 1415 may be a PSTN, in which case the communication interface 1414 may be an integrated services digital network (ISDN) card or a modem.

A computer system 1400 may transmit and receive messages, data, and instructions, including program, i.e., application, code, through its respective communication link 1415 and communication interface 1414. Received program code may be executed by the respective processor(s) 1407 as it is received, and/or stored in the storage device 1410, or other associated non-volatile media, for later execution.

In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals, that include data streams representing various types of signal information, e.g., instructions, messages and data. In embodiments of the invention, the functions of the data interface 1433 may be performed by the communication interface 1414.

Computer system 1400 includes a bus 1406 or other communication mechanism for communicating instructions, messages and data, collectively, information, and one or more processors 1407 coupled with the bus 1406 for processing information. Computer system 1400 also includes a main memory 1408, such as a random access memory (RAM) or other dynamic storage device, coupled to the bus 1406 for storing dynamic data and instructions to be executed by the processor(s) 1407. The main memory 1408 also may be used for storing temporary data, i.e., variables, or other intermediate information during execution of instructions by the processor(s) 1407.

The computer system 1400 may further include a read only memory (ROM) 1409 or other static storage device coupled to the bus 1406 for storing static data and instructions for the processor(s) 1407. A storage device 1410, such as a magnetic disk or optical disk, may also be provided and coupled to the bus 1406 for storing data and instructions for the processor(s) 1407.

A computer system 1400 may be coupled via the bus 1406 to a display device 1411, such as, but not limited to, a cathode ray tube (CRT), for displaying information to a user. An input device 1412, e.g., alphanumeric and other keys, is coupled to the bus 1406 for communicating information and command selections to the processor(s) 1407.

According to one embodiment of the invention, an individual computer system 1400 performs specific operations by their respective processor(s) 1407 executing one or more sequences of one or more instructions contained in the main memory 1408. Such instructions may be read into the main memory 1408 from another computer-usable medium, such as the ROM 1409 or the storage device 1410. Execution of the sequences of instructions contained in the main memory 1408 causes the processor(s) 1407 to perform the processes described herein. In alternative embodiments, hard-wired circuitry may be used in place of or in combination with software instructions to implement the invention. Thus, embodiments of the invention are not limited to any specific combination of hardware circuitry and/or software.

The term "computer-usable medium," as used herein, refers to any medium that provides information or is usable by the processor(s) 1407. Such a medium may take many forms, including, but not limited to, non-volatile, volatile and transmission media. Non-volatile media, i.e., media that can retain information in the absence of power, includes the ROM 1409, CD ROM, magnetic tape, and magnetic discs. Volatile media, i.e., media that can not retain information in the absence of power, includes the main memory 1408. Transmission media includes coaxial cables, copper wire and fiber optics, including the wires that comprise the bus 1406. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the solution has been described with reference to specific embodiments thereof. It will, however, be evident that various modifications and changes may be made thereto without departing from the broader spirit and scope. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense.

I claim:

1. A method for simulating a circuit comprising:
using a computer system, characterizing one or more channels, each channel being a dedicated path through which a node is driven by a single driver, wherein the characterizing one or more channels comprises deriving a response of the one or more channels in a time domain; determining optimum filter settings; and displaying or storing in a computer-usable medium the optimum filter settings.

2. The method of claim 1, wherein characterizing one or more channels comprises:
applying an impulse to each channel;
obtaining an impulse response for each channel; and
storing the impulse response for each channel.

3. The method of claim 1 wherein the impulse response of each channel includes effects of neighboring channels.

4. The method of claim 1, wherein characterizing one or more channels comprises retrieving the impulse response of each channel from a storage device.

5. The method of claim 2, wherein obtaining the impulse response of the channel comprises obtaining the impulse response in a time domain.

6. The method of claim 2, wherein characterizing one or more channels further comprises:
building a circuit model of the circuit design, the circuit model comprising a node driven by a plurality of drivers through a single channel; and
converting the circuit model to a plurality of channels.

7. The method of claim 2, wherein determining optimal filter settings comprises:
inputting the impulse response of the channel characterization into a circuit simulator;
using the simulator to calculate optimal filter settings;
using the optimal filter settings in subsequent simulations.

8. The method of claim 2, further comprising:
providing a channel output plot by computing an inverse Fast Fourier Transform on a convolution sum of the impulse response and a bit stream in a frequency domain.

9. The method of claim 8, wherein the bit stream includes at least 100, 10,000 or 100,000 bits.

10. The method of claim 8, wherein the output plot is one or more of an eye contour plot, a series of eye contours at fixed bit vs. time intervals, an eye distribution plot, or a time vs. voltage waveform plot and the output plot is computed in less than 10 seconds.

11. The method of claim 8, further comprising comparing the channel output plot to a circuit model output plot, the circuit model comprising a node driven by a plurality of drivers through a single channel.

12. A system for simulating a circuit comprising:
a processor;
means for characterizing one or more channels, each channel being a dedicated path through which a node is driven by a single driver, wherein the characterizing one or more channels comprises deriving a response of the one or more channels in a time domain; and
means for determining optimum filter settings.

13. The system of claim 12, wherein the means for characterizing one or more channels comprises:
means for applying an impulse to each channel;
means for obtaining an impulse response for each channel; and
means for storing the impulse response for each channel.

14. The system of claim 13 wherein the impulse response of each channel includes effects of neighboring channels.

15. The system of claim 12, wherein the means for characterizing one or more channels comprises means for retrieving the impulse response of each channel from a storage device.

16. The system of claim 13, wherein the means for obtaining the impulse response of the channel comprises means for obtaining the impulse response in a time domain.

17. The system of claim 12 wherein the means for characterizing one or more channels further comprises:
means for building a circuit model of the circuit design, the circuit model comprising a node driven by a plurality of drivers through a single channel; and
means for converting the circuit model to a plurality of channels.

18. The system of claim 12, wherein the means for determining optimal filter settings comprises:
   means for inputting the impulse response of the channel characterization into a circuit simulator;
   means for using the simulator to calculate optimal filter settings;
   means for using the optimal filter settings in subsequent simulations.

19. The system of claim 13, further comprising:
   means for providing a channel output plot by computing an inverse Fast Fourier Transform on a convolution sum of the impulse response and a bit stream in a frequency domain, the bit stream including at least 100 bits.

20. The system of claim 19, wherein the channel output plot is one or more of an eye contour plot, a series of eye contours at fixed bit vs. time intervals, an eye distribution plot, or a time vs. voltage waveform plot and the output plot is computed in less than 10 seconds.

21. The system of claim 19, further comprising means for comparing the channel output plot to a circuit model output plot.

22. A computer program product embodied on computer readable storage medium, the computer readable storage medium having stored thereon a sequence of instructions which, when executed by a processor, causes the processor to execute a method for simulating a circuit, the method comprising:
   characterizing one or more channels, each channel being a dedicated path through which a node is driven by a single driver, wherein the characterizing one or more channels comprises deriving a response of the one or more channels in a time domain; and
   determining optimum filter settings.

23. The computer program product of claim 22, wherein the means for characterizing one or more channels comprises:
   applying an impulse to each channel;
   obtaining an impulse response for each channel; and
   storing the impulse response for each channel.

24. The computer program product of claim 23 wherein the impulse response of each channel includes effects of neighboring channels.

25. The computer program product of claim 22, wherein characterizing one or more channels comprises retrieving the impulse response of each channel from a storage device.

26. The computer program product of claim 23, wherein the obtaining the impulse response of the channel further comprises obtaining the impulse response in a time domain.

27. The computer program product of claim 22 wherein characterizing one or more channels further comprises:
   building a circuit model of the circuit design, the circuit model comprising a node driven by a plurality of drivers through a single channel; and
   converting the circuit model to a plurality of channels.

28. The computer program product of claim 23, wherein determining optimal filter settings comprises:
   inputting the impulse response of the channel characterization into a circuit simulator;
   using the simulator to calculate optimal filter settings;
   using the optimal filter settings in subsequent simulations.

29. The computer program product of claim 23, further comprising:
   providing a channel output plot by computing an inverse Fast Fourier Transform on a convolution sum of the impulse response and a bit stream in a frequency domain, the bit stream including at least 100 bits.

30. The computer program product of claim 29, wherein the channel output plot is one or more of an eye contour plot, a series of eye contours at fixed bit vs. time intervals, an eye distribution plot, or a time vs. voltage waveform plot and the output plot is computed in less than 10 seconds.

31. The computer program product of claim 29, further comprising comparing the channel output plot to a circuit model output plot.

* * * * *

UNITED STATES PATENT AND TRADEMARK OFFICE
CERTIFICATE OF CORRECTION

PATENT NO. : 7,627,463 B2 Page 1 of 1
APPLICATION NO. : 11/089898
DATED : December 1, 2009
INVENTOR(S) : Kumar Chidhambarakrishnan It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1196 days.

Signed and Sealed this

Second Day of November, 2010

David J. Kappos
*Director of the United States Patent and Trademark Office*